(12) United States Patent
Sakamoto

(10) Patent No.: US 8,596,397 B2
(45) Date of Patent: Dec. 3, 2013

(54) INVERTER MOUNTING STRUCTURE FOR VEHICLE

(75) Inventor: Tetsuo Sakamoto, Shizuoka (JP)

(73) Assignee: Suzuki Motor Corporation, Shizuoka (JP)

( * ) Notice: Subject to any disclaimer, the term of this patent is extended or adjusted under 35 U.S.C. 154(b) by 0 days.

(21) Appl. No.: 13/556,249

(22) Filed: Jul. 24, 2012

(65) Prior Publication Data

US 2013/0037335 A1 Feb. 14, 2013

(30) Foreign Application Priority Data

Aug. 9, 2011 (JP) ................................. 2011-173852

(51) Int. Cl.
*B60R 16/03* (2006.01)

(52) U.S. Cl.
USPC .......................................................... 180/68.5

(58) Field of Classification Search
USPC .............................................. 180/65.8, 68.5
See application file for complete search history.

(56) References Cited

U.S. PATENT DOCUMENTS

| | | | | |
|---|---|---|---|---|
| 7,855,887 B2 * | 12/2010 | Kakuda et al. | | 361/699 |
| 7,874,395 B2 * | 1/2011 | Taji et al. | | 180/300 |
| 7,957,169 B2 * | 6/2011 | Nakajima et al. | | 363/141 |
| 7,973,439 B2 * | 7/2011 | Watanabe et al. | | 310/71 |
| 7,997,377 B2 * | 8/2011 | Kim et al. | | 180/312 |
| 8,007,255 B2 * | 8/2011 | Hattori et al. | | 417/410.1 |
| 8,344,566 B2 * | 1/2013 | Koshida | | 310/89 |
| 8,474,555 B2 * | 7/2013 | Kanno | | 180/65.1 |
| 8,517,127 B2 * | 8/2013 | Kanno | | 180/65.1 |
| 2004/0079569 A1 * | 4/2004 | Awakawa | | 180/68.5 |
| 2008/0078603 A1 * | 4/2008 | Taji et al. | | 180/312 |
| 2008/0117602 A1 * | 5/2008 | Korich et al. | | 361/715 |
| 2008/0205107 A1 * | 8/2008 | Hattori et al. | | 361/715 |
| 2008/0225487 A1 * | 9/2008 | Nakajima et al. | | 361/699 |
| 2010/0188814 A1 * | 7/2010 | Nakatsu et al. | | 361/689 |
| 2010/0247349 A1 * | 9/2010 | Asai et al. | | 417/410.1 |
| 2011/0162902 A1 * | 7/2011 | Dobbins et al. | | 180/68.5 |
| 2011/0170259 A1 * | 7/2011 | Miller et al. | | 361/689 |
| 2012/0031689 A1 * | 2/2012 | Kanno | | 180/65.1 |
| 2012/0031690 A1 * | 2/2012 | Kanno | | 180/65.1 |
| 2012/0170217 A1 * | 7/2012 | Nishikimi et al. | | 361/689 |
| 2012/0248909 A1 * | 10/2012 | Ito et al. | | 310/64 |
| 2012/0250384 A1 * | 10/2012 | Ito et al. | | 363/132 |
| 2013/0037335 A1 * | 2/2013 | Sakamoto | | 180/65.8 |
| 2013/0062724 A1 * | 3/2013 | Tokuyama et al. | | 257/499 |

FOREIGN PATENT DOCUMENTS

JP 2009-286287 A 12/2009

* cited by examiner

*Primary Examiner* — Jeffrey J Restifo
*Assistant Examiner* — Erez Gurari
(74) *Attorney, Agent, or Firm* — Rothwell, Figg, Ernst & Manbeck, P.C.

(57) ABSTRACT

A supporting portion of an inverter bracket is made of cast, and the inverter bracket is attached onto the side member to locate a vehicle rear end portion of the attachment portion to be on the front side in the vehicle, by a prescribed distance from a vehicle front surface portion of the suspension tower. When a force F is exerted from the front side of the vehicle, the side member curves outward in the vehicle width direction between one part to which the suspension tower is coupled and another part to which the inverter bracket is attached. The inverter bracket and inverter are pushed obliquely outward in the vehicle width direction, so that the contact with the master cylinder can be suppressed.

3 Claims, 8 Drawing Sheets

F I G. 1
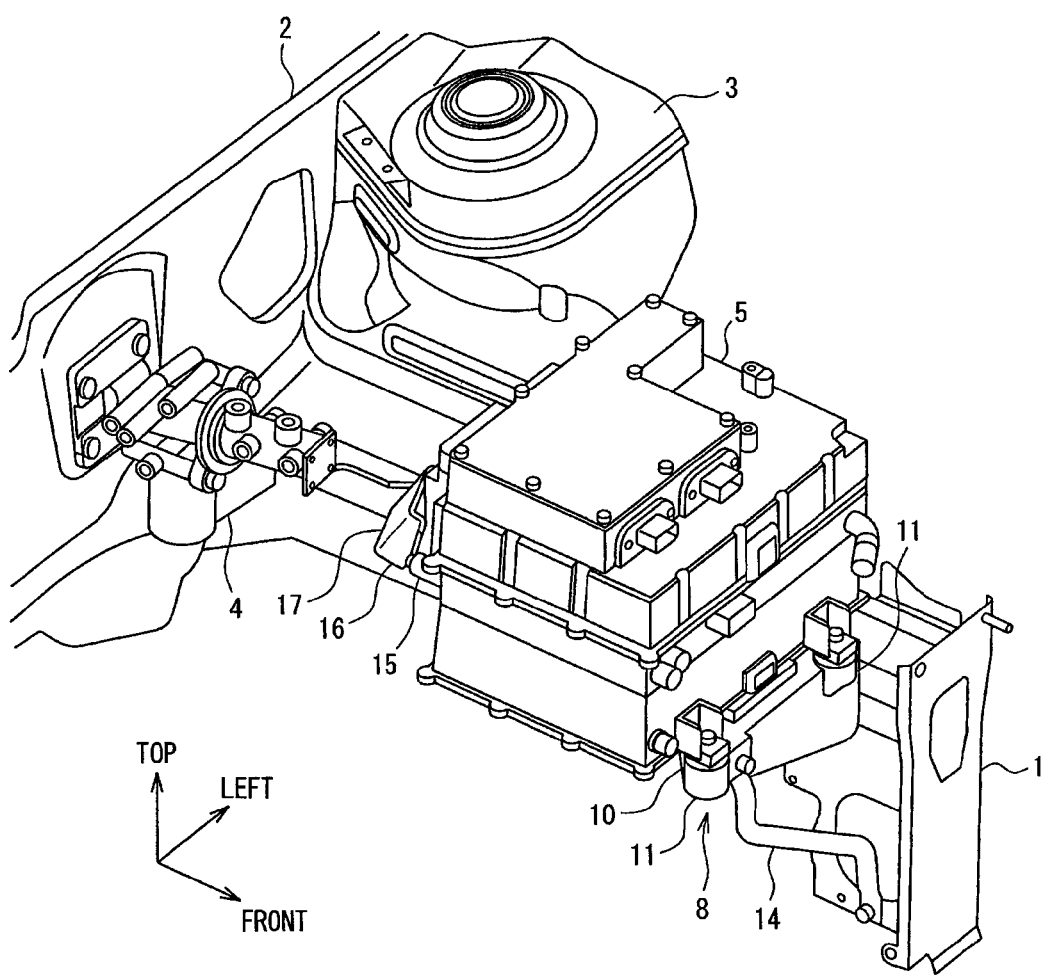

INVERTER MOUNTING STRUCTURE FOR VEHICLE

CROSS-REFERENCE

This document claims priority to Japanese Application Number 2011-173852, filed Aug. 9, 2011, the entire content of which is hereby incorporated by reference.

TECHNICAL FIELD

The present invention relates to an inverter mounting structure in a vehicle to be suitable for mounting, for example, an inverter for driving a motor of an electric vehicle or a hybrid vehicle.

BACKGROUND ART

In order to drive the motor efficiently, it is desirable to apply alternating current to the motor. On the other hand, the output from a battery, which is an electric storage device, is direct current. Accordingly, an inverter is indispensable for a vehicle that stores electricity in a battery and that is driven by a motor, such as an electric vehicle or a hybrid vehicle. For instance, Patent Document 1 listed below describes that the inverter is mounted in an engine room on the front side of the vehicle.

PRIOR ART DOCUMENTS

Patent Documents

Patent Document 1: JP 2009-286287 A

SUMMARY OF THE INVENTION

Problem to be Solved

It is to be noted that however, a dash panel arranged, on the rear side of the vehicle, in the engine room is provided with a cylindrical master cylinder to protrude frontward in the vehicle. Since the inverter has a large size in width, height, and depth, the inverter and the master cylinder are arranged to overlap each other in the vehicle front-rear direction. When a force is exerted onto the front part of the vehicle from the front side of the vehicle having such a layout, the inverter is pushed rearward in the vehicle and brought into contact with the master cylinder. Then, the inverter pushes the master cylinder itself or the dash panel provided with the master cylinder rearward in the vehicle. This might reduce the space in the vehicle interior. Hence, the inverter and the master cylinder can be separated in the vehicle front-rear direction. However, there is a limitation in the length in the front-rear direction of the engine room, and therefore it is difficult to separate the inverter and the master cylinder so that they will not come into contact with each other when the load is applied from the front side of the vehicle. Besides, in a case where a connector for connecting electrical wires is provided on a wall portion, of the inverter, on the rear side of the vehicle, protection is necessary so that the connector should not come into contact with the master cylinder.

The present invention has been made in view of the above problem, and has an object to provide an inverter mounting structure for a vehicle capable of suppressing the master cylinder or the dash panel from being pushed into the vehicle interior, even when a force is applied from the vehicle front side.

Solution to the Problem

According to an aspect of the present invention, there is provided an inverter mounting structure of a vehicle, the inverter mounting structure comprising: a side member arranged on a side portion in an engine room on a front side in the vehicle, and being longitudinal in a vehicle front-rear direction; a dash panel coupled to the side member at a rear part of the engine room; a suspension tower protruding frontward in the vehicle from the dash panel, and coupled to a front surface portion of the dash panel and to an outside in a vehicle width direction of the side member; a master cylinder to protrude frontward in the vehicle from the dash panel; an inverter bracket made of casting and having an attachment portion to be attached onto the side member along a longitudinal wall portion and an upper surface portion of the side member, and a supporting portion protruding inward in the engine room from the attachment portion; and an inverter mounted on an upper surface of a supporting portion of the inverter bracket, and mounted on the front side in the vehicle than the master cylinder, wherein the inverter bracket is attached onto the side member to locate a vehicle rear end portion of the attachment portion to be on the front side in the vehicle, by a prescribed distance from a vehicle front surface portion of the suspension tower.

In addition, a protector may be attached on a wall surface of the inverter facing the master cylinder, and the protector may have at least an inclined surface inclined rearward to the outside in the vehicle width direction from the inside in the vehicle width direction.

Furthermore, the inverter may have a connector for connecting electrical wires on a wall surface facing the master cylinder, and the protector may cover the connector.

Advantageous Effects of the Invention

Therefore, according to an embodiment of the present invention, the inverter bracket is made of casting. Hence, when a force is exerted from the front side of the vehicle onto the supporting portion of the inverter bracket, it is possible to prevent the deformation of the inverter bracket itself and the side member to which the inverter bracket is attached. As a result, apart of the side member between the part to which the suspension tower is coupled and another part to which the inverter bracket is attached can be made weaker than these parts. In this situation, the vehicle rear end portion of the attachment portion is provided such that the inverter bracket is located on the front side in the vehicle by a prescribed distance from the vehicle front surface portion of the suspension tower. When the force is exerted from the front side of the vehicle, a part of the side member between the part to which the suspension tower is coupled and another part to which the inverter bracket is attached is inflected outward in the vehicle width direction. Accordingly, the inverter bracket and the inverter are pushed obliquely outward in the vehicle width direction. This suppresses the master cylinder from being pushed rearward in the vehicle. As a result, it is possible to suppress the master cylinder or the dash panel from being pushed into the vehicle interior.

In addition, the protector having the inclined surface inclined at least rearward to the outside in the vehicle width direction from the inside in the vehicle width direction is attached onto the wall surface of the master cylinder facing the inverter. Even if the force exerted from the front side of the vehicle brings the inverter into contact with the master cylinder, the inverter is pushed obliquely outward in the vehicle width direction along the inclined surface of the protector.

Consequently, it is possible to suppress the master cylinder or the dash panel from being pushed into the vehicle interior. As a result, it is possible to suppress the master cylinder or the dash panel from being pushed into the vehicle interior.

Furthermore, in a case where the connector for connecting electric wires is provided on the wall surface of the inverter facing the master cylinder, the protector covering the connector is capable of protecting the connector of the inverter, even if the force is exerted from the front side of the vehicle.

BRIEF DESCRIPTION OF THE DRAWINGS

FIG. 1 is a perspective view of a front left part of an engine room illustrative of an inverter mounting structure of a vehicle according to a present embodiment of the present invention;

DESCRIPTION OF EMBODIMENTS

Embodiments of the present invention will now be described with reference to the drawings.

Now, an embodiment of an inverter mounting structure of a vehicle according to the present invention will be described with reference to the drawings.

Figure 2:
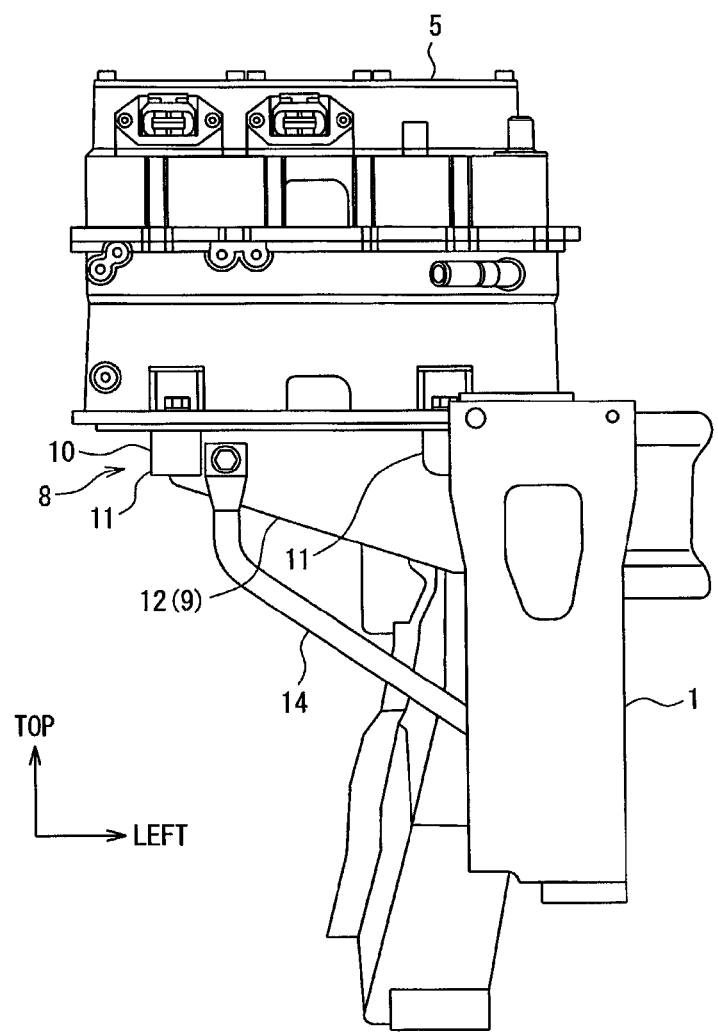
FIG. 2 is a front view of the engine room of FIG. 1.
Figure 3:
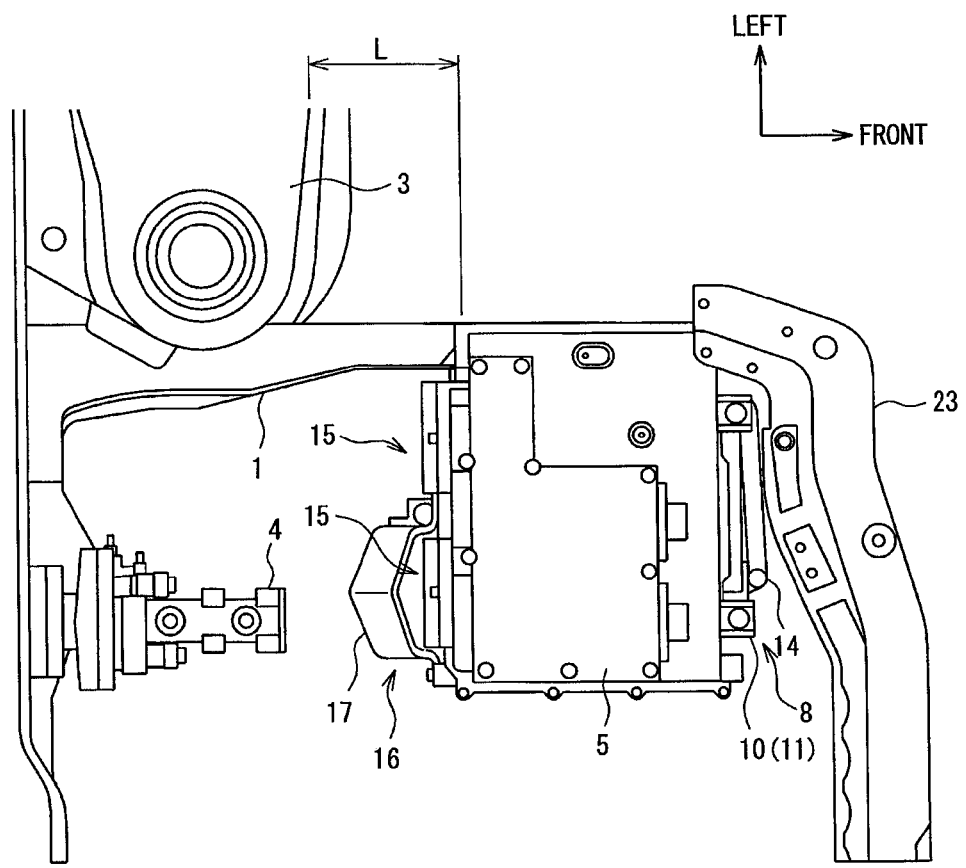
FIG. 3 is a plan view of the engine room of FIG. 1.
Figure 4:
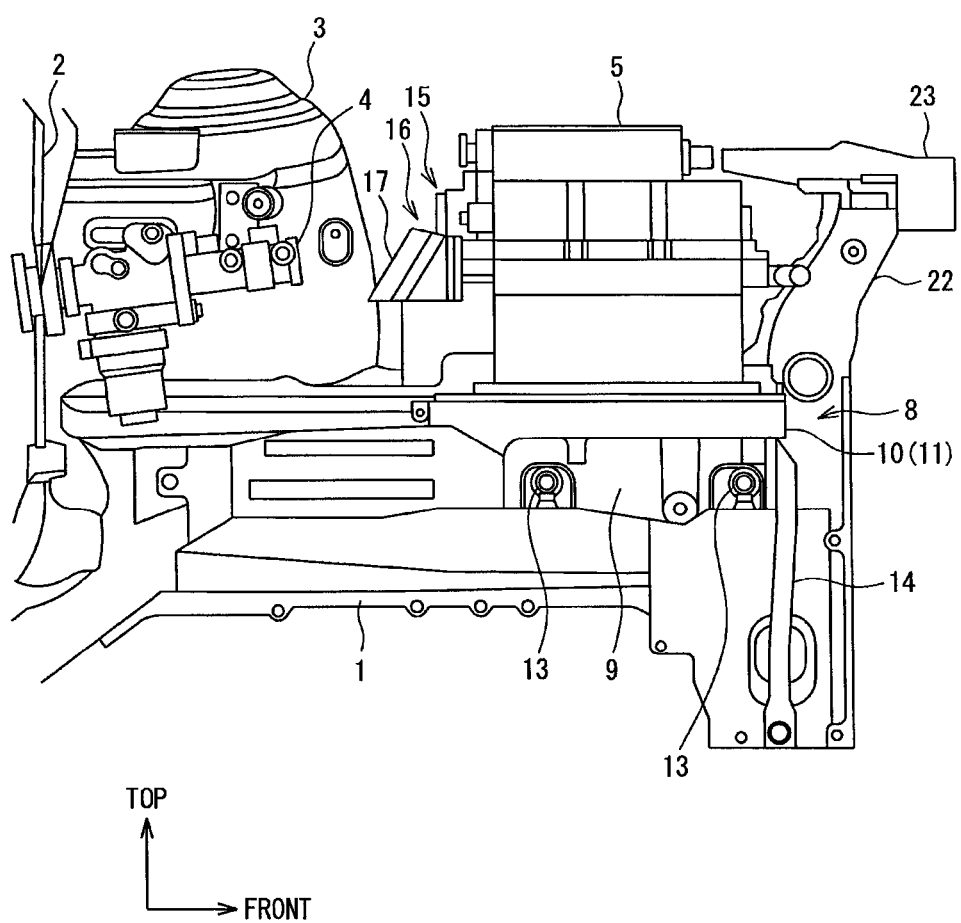
FIG. 4 is an inner side view of the engine room of FIG. 1.
Figure 5:
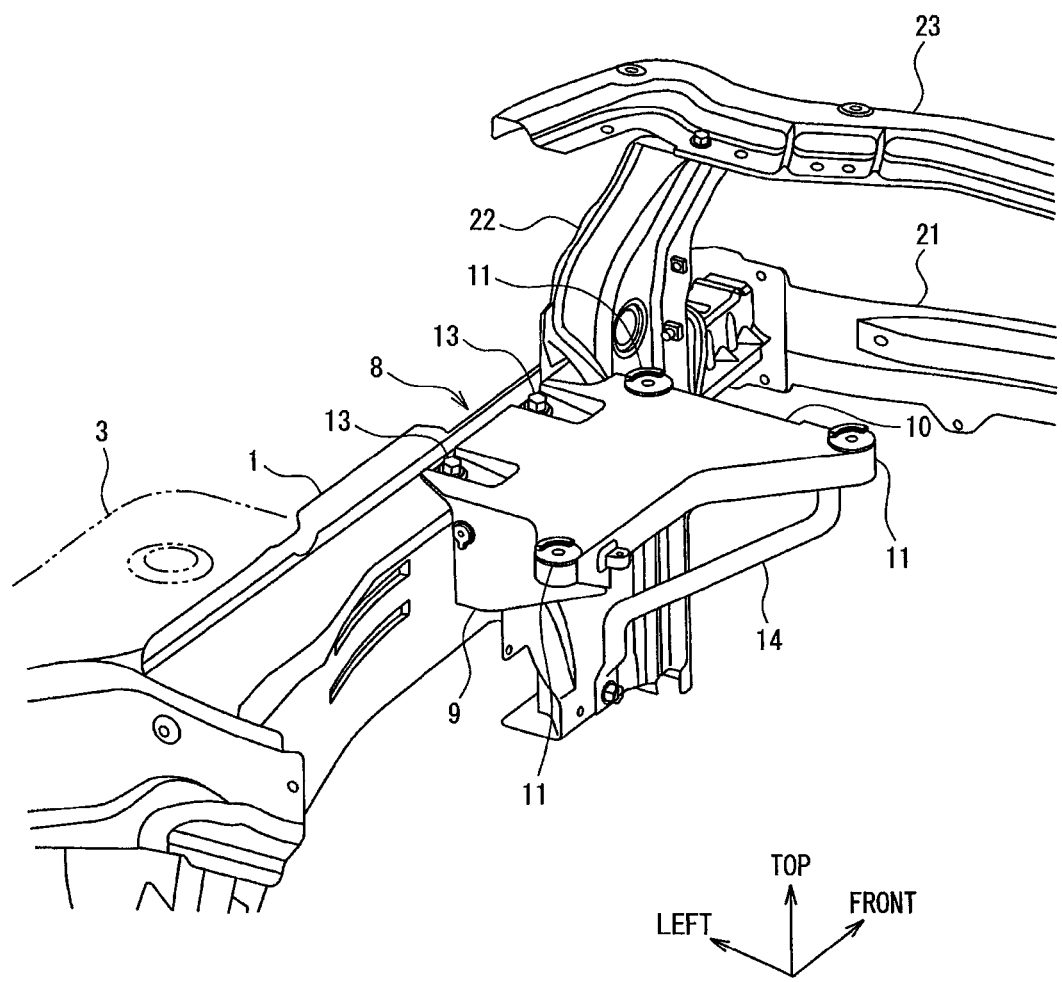
FIG. 5 is a perspective view of a side member and an inverter bracket of FIG. 1, when viewed from obliquely right rear side.
Figure 6:
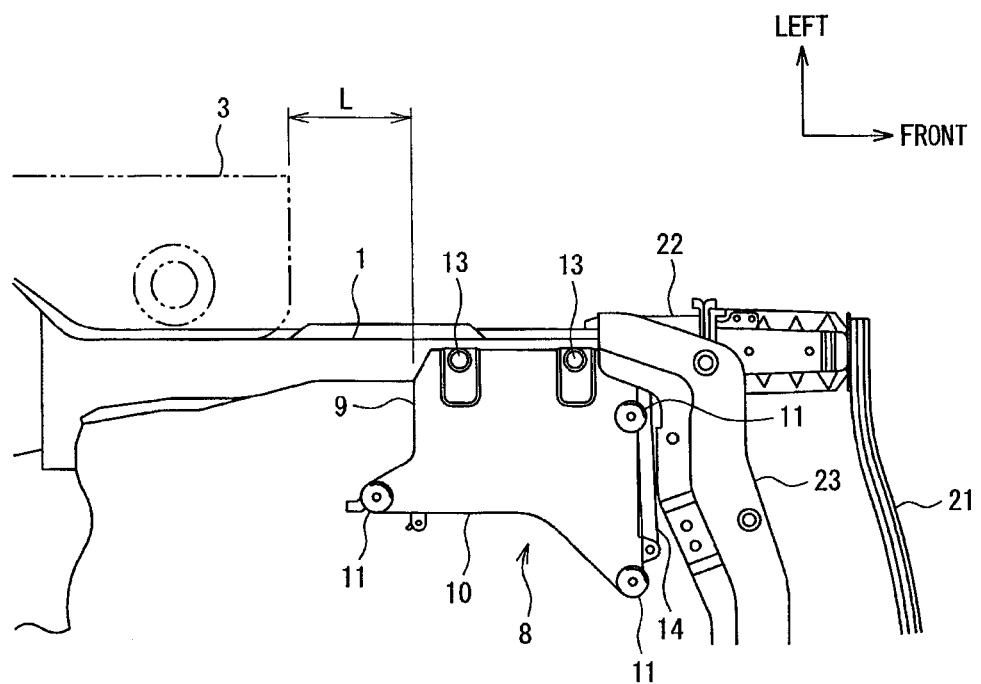
FIG. 6 is a plan view of the side member and the inverter bracket of FIG. 5.

FIG. 1 is a perspective view of a front left part of an engine room illustrative of an inverter mounting structure of a vehicle according to the present embodiment. FIG. 2 is a front view of the engine room of FIG. 1. FIG. 3 is a plan view of the engine room of FIG. 1. FIG. 4 is an inner side surface view of the engine room of FIG. 1. FIG. 5 is a perspective view of a side member and an inverter bracket of FIG. 1, when they are viewed from obliquely right rear side. FIG. 6 is a plan view of the side member and the inverter bracket of FIG. 5. Specifically, the vehicle according to the present embodiment is a hybrid vehicle to be driven by an engine and a motor.

Reference numeral 1 in the drawings is a side member being longitudinal in the vehicle front-rear direction and arranged on both side portions in the width direction of the engine room on the front side in the vehicle. In the drawings, the side member on the left side portion is illustrated. A dash panel 2 for partitioning the engine room and the vehicle interior is coupled to a part arranged at the rear part of the engine room, of the side member 1. Specifically, the left part of the dash panel 2 is provided with a master cylinder 4 to protrude frontward in the vehicle from the dash panel 2. Additionally, at the vehicle front end portion of the side member 1, there are provided: a bumper member 21 for coupling the side member 1 in the vehicle width direction; a lamp support brace 22 standing upward from the side member 1 to support the front lamp; and an upper cross member 23 for coupling the upper end portion of the lamp support brace 22 in the vehicle width direction.

A suspension tower 3 protruding frontward in the vehicle from the dash panel 2 is coupled to the front surface portion of the dash panel 2 and to the outside in the vehicle width direction of the side member 1. The suspension tower 3 is a part for accommodating a so-called strut (supporting post) constituted with a shock absorber or spring of the suspension, and has a shape of a hollow dome. Since the upper end portion of the suspension tower 3 is coupled by the upper end portion of the strut, the suspension tower 3 to which the strut is coupled has a high strength.

Figure 7:
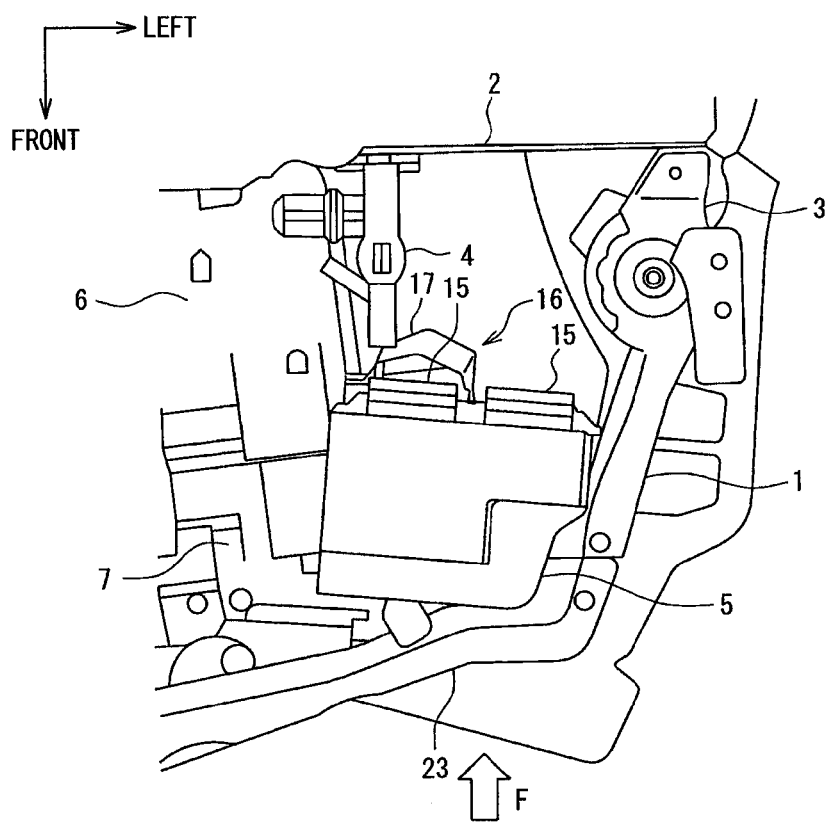
FIG. 7 is a plan view illustrative of an initial stage when a force is exerted onto the engine room from the vehicle front side.
Figure 8:
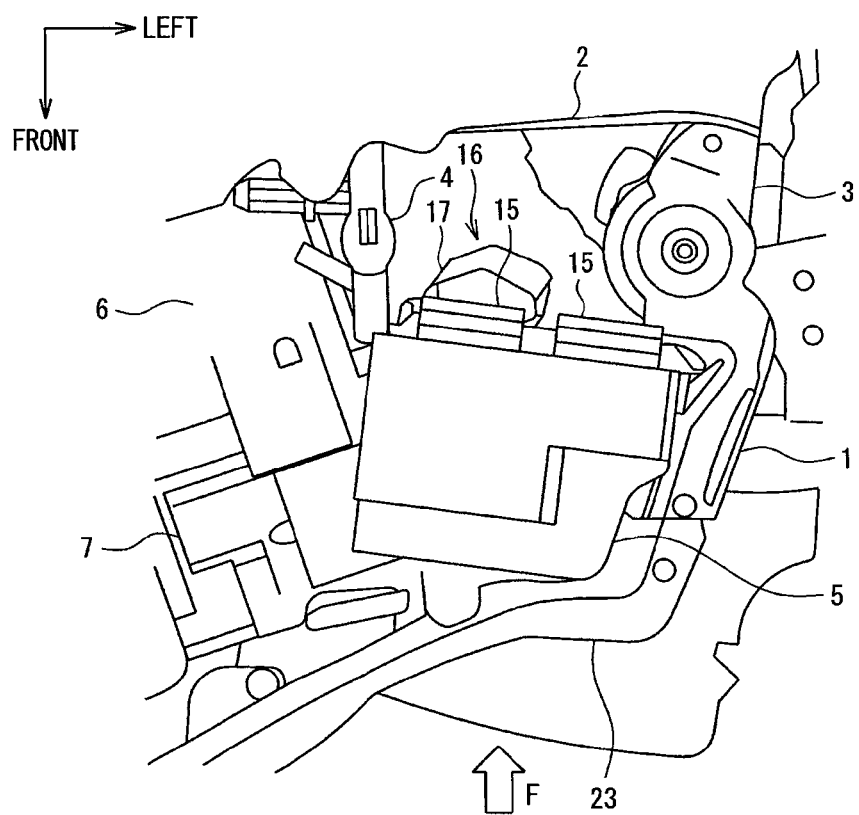
FIG. 8 is a plan view illustrative of a later stage when the force is exerted onto the engine room from the vehicle front side.

The inverter 5 for driving the motor is located on the front side of the master cylinder 4 near the side member 1 arranged on the side of a motor 6 or a generator 7 (see FIG. 7 and FIG. 8). The inverter 5 is attached onto the side member 1 via an inverter bracket 8. The inverter bracket 8 includes: an attachment portion 9 to be attached onto the side member 1 along the longitudinal wall portion and the upper surface portion of the side member 1; and a supporting portion 10 protruding inward in the engine room from the attachment portion 9. In the inverter bracket 8, the attachment portion 9 and the supporting portion 10 are made of, for example, aluminum cast. As illustrated in FIG. 5, in particular, the supporting portion 10 having a thick plate shape has strength higher than that of a pressed plate member.

The supporting portion 10 is provided with three attachment bosses 11 in total, including two attachment bosses 11 on front side in the vehicle and one attachment boss 11 on the rear side in the vehicle, for attaching the inverter 5 on the top surface. The inverter 5 is mounted and fixed to these attachment bosses 11 by fixtures such as bolts. On the other hand, the attachment portion 9 is provided with four attachment holes in total, including two attachment holes at the upper part and two attachment holes on the vehicle left inner side. The attachment portion 9 is placed on the longitudinal wall portion and the upper surface portion of the side member 1, and bolts 13 are respectively inserted into attachment holes to be screwed in the side member 1. Specifically, reference numeral 12 in FIG. 2 denotes a reinforcement rib arranged between the vehicle front end portion of the supporting portion 10 and the attachment portion 9. Additionally, a stiffener 14 that is a reinforcement member is interposed between the vehicle front end portion of the supporting portion 10 and the side member 1.

An important point in the present embodiment is that, as illustrated in FIG. 6, the inverter bracket 8 is attached onto the side member 1 such that the vehicle rear end portion of the attachment portion 9 in the inverter bracket 8 is located on the front side in the vehicle, by a prescribed distance L from the vehicle front surface portion of the suspension tower 3. As described above, since the suspension tower 3 coupled with the strut has a high strength, one part in the side member 1 to which the suspension tower 3 is coupled also has a high strength. In addition, since the supporting portion 10 in the inverter bracket 8 particularly has a high strength, another part in the side member 1 to which the inverter bracket 8 is attached also has a high strength. Accordingly, yet another part in the side member 1 between the part to which the suspension tower 3 is coupled and another part to which the inverter bracket 8 is attached is weaker than these parts. Hence, when a force is exerted onto the inverter bracket 8 from the vehicle front side, yet another part is inflected outward in the vehicle width direction as will be described later.

As the inverter 5 is an electric part, the inverter 5 is provided with multiple connectors for connecting electric cables. In the present embodiment, however, high-voltage connectors 15 for connecting electric wires are provided on a wall surface of the inverter 5 so as to face a protruding end portion of the master cylinder 4. Two connectors 15 are arranged side by side in the vehicle width direction. In the present embodiment, one of the connectors 15 facing the protruding end portion of the master cylinder 4 is covered with a protector 16 so as to protect the connector 15 from the master cylinder 4, for example, when a force is exerted from the vehicle front side and the inverter 5 moves rearward.

The protector 16 has an inclined surface 17 inclined rearward to the outside in the vehicle width direction from the inside in the vehicle width direction at least at a position on the front side of the vehicle in the master cylinder 4, as illustrated in FIG. 3. The inclined surface 17 is also inclined toward the vehicle lower rear side from the vehicle front upper side, as illustrated in FIG. 4. In the present embodiment, however, it is important that the inclined surface 17 be inclined at least rearward to the outside in the vehicle width direction from an end portion of the inner side in the vehicle width direction. When a force is exerted from the vehicle front side, the inverter 5 is pushed rearward in the vehicle, and the connector 15 is about to be in contact with the protruding end portion of the master cylinder 4, the inclined surface 17 has an effect of pushing out the inverter 5 outward in the vehicle width direction so as to suppress the master cylinder 4 or the dash panel 2 from being pushed into the vehicle interior.

FIG. 7 is a plan view illustrative of an initial stage when a force is exerted onto the engine room from the front side of the vehicle. FIG. 8 is a plan view illustrative of a later stage when the force is exerted onto the engine room from the front side of the vehicle. As described above, since one part of the side member 1 to which the suspension tower 3 is coupled has a high strength and another part of the side member 1 to which the inverter bracket 8 is attached also has a high strength, yet another part of the side member 1 between the part to which the suspension tower 3 is coupled and another part to which the inverter bracket 8 is attached is weaker than these parts. Accordingly, when a force F is exerted onto the inverter 5 or the inverter bracket 8 from the front side of the vehicle, yet another part of the side member 1 is inflected outward in the vehicle width direction between one part to which the suspension tower 3 is coupled and another part to which the inverter bracket 8 is attached. In response to this, the inverter 5 moves outward in the vehicle width direction while being pushed rearward in the vehicle.

When the inverter 5 is about to be in contact with the master cylinder 4, as illustrated in FIG. 7, the inclined surface 17 of the protector 16 covering the connector 15 is brought into contact with the protruding end portion of the master cylinder 4. In such a state, when the inverter 5 is further pushed rearward by the force F exerted from the front side of the vehicle, the protruding end portion of the master cylinder 4 serves as a guide of the inclined surface 17 of the protector 16. As illustrated in FIG. 8, the inverter 5 is pushed rearward to the outside in the vehicle width direction along the inclined surface 17, and the master cylinder 4 or the dash panel 2 is suppressed from being pushed out rearward in the vehicle. As a result, it is possible to suppress the master cylinder 4 or the dash panel 2 from being pushed into the vehicle interior. Additionally, as the connector 15 is covered with the protector 16, the connector 15 can be protected.

In the inverter mounting structure according to the present embodiment as described above, since the inverter bracket 8 is made of casting, it is possible to prevent deformation of the inverter bracket 8 itself and the part of the side member 1 to which the inverter bracket 8 is attached, when the force F is exerted onto the supporting portion 10 of the inverter bracket 8 from the front side of the vehicle. As a result, yet another part of the side member 1 between the part to which the suspension tower 3 is coupled and another part to which the inverter bracket 8 is attached is weaker than these parts. In this situation, the vehicle rear end portion of the attachment portion 9 is provided such that the inverter bracket 8 is located on the front side in the vehicle by a prescribed distance L from the vehicle front surface portion of the suspension tower 3. When the force is exerted onto the inverter 5 or the front part of the inverter bracket 8 from the front side of the vehicle, yet another part of the side member 1 between the part to which the suspension tower 3 is coupled and another part to which the inverter bracket 8 is attached is inflected outward in the vehicle width direction. Accordingly, the inverter bracket 8 and the inverter 5 are pushed obliquely outward in the vehicle width direction.

As a result, it is possible to suppress the master cylinder 4 or the dash panel 2 from being pushed into the vehicle interior.

In addition, the protector 16 having the inclined surface 17 inclined at least rearward to the outside in the vehicle width direction from the inside in the vehicle width direction is attached onto the wall surface of the inverter 5 facing the master cylinder 4. Even if the force F exerted from the front side of the vehicle brings the inverter 5 into contact with the master cylinder 4, the inverter 5 is pushed obliquely outward in the vehicle width direction along the inclined surface 17 of the protector 16. Consequently, it is possible to suppress the master cylinder 4 or the dash panel 2 from being pushed into the vehicle interior.

Furthermore, in a case where the connector 15 for connecting electric wires is provided on the wall surface of the inverter 5 facing the master cylinder 4, the protector 16 covering the connector 15 is capable of protecting the connector 15 of the inverter 5, even if the force F is exerted from the front side of the vehicle.

REFERENCE SIGNS LIST 1 side member
2 dash panel
3 suspension tower
4 master cylinder
5 inverter
6 motor
7 generator
8 inverter bracket
9 attachment portion
10 supporting portion
11 attachment boss
12 reinforcement rib
13 bolt
14 stiffener
15 connector
16 protector
17 inclined surface
21 bumper member
22 lamp support brace
23 upper cross member

The invention claimed is:

1. An inverter mounting structure for a vehicle, the inverter mounting structure comprising:
a side member arranged on a side portion in an engine room on a front side in the vehicle, and being longitudinal in a vehicle front-rear direction;
a dash panel coupled to the side member at a rear part of the engine room;
a suspension tower protruding frontward in the vehicle from the dash panel, and coupled to a front surface portion of the dash panel and to an outside in a vehicle width direction of the side member;
a master cylinder to protrude frontward in the vehicle from the dash panel;
an inverter bracket made of casting and having an attachment portion to be attached onto the side member along a longitudinal wall portion and an upper surface portion of the side member, and a supporting portion protruding inward in the engine room from the attachment portion; and
an inverter mounted on an upper surface of a supporting portion of the inverter bracket, and mounted on the front side in the vehicle than the master cylinder,
wherein the inverter bracket is attached onto the side member to locate a vehicle rear end portion of the attachment portion to be on the front side in the vehicle, by a prescribed distance from a vehicle front surface portion of the suspension tower.

2. The inverter mounting structure for the vehicle according to claim 1,
wherein a protector is attached on a wall surface of the inverter facing the master cylinder, and
wherein the protector has at least an inclined surface inclined rearward to the outside in the vehicle width direction from the inside in the vehicle width direction.

3. The inverter mounting structure for the vehicle according to claim 2,
wherein the inverter has a connector for connecting electrical wires on a wall surface facing the master cylinder, and
wherein the protector covers the connector.

* * * * *